US010162393B2

(12) United States Patent
Fruge et al.

(10) Patent No.: US 10,162,393 B2
(45) Date of Patent: Dec. 25, 2018

(54) ELECTRICAL CONNECTOR WITH FORCE BALANCING

(71) Applicant: Seagate Technology LLC, Cupertino, CA (US)

(72) Inventors: Tave Joseph Fruge, Louisville, CO (US); Frank William Bernett, Niwot, CO (US); John Francis Fletcher, Longmont, CO (US); Richard K. Thompson, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/994,884

(22) Filed: Jan. 13, 2016

(65) Prior Publication Data

US 2017/0201042 A1    Jul. 13, 2017

(51) Int. Cl.
| | |
|---|---|
| *G11B 33/12* | (2006.01) |
| *G06F 1/18* | (2006.01) |
| *H01R 12/70* | (2011.01) |
| *H01R 12/91* | (2011.01) |
| *H05K 5/00* | (2006.01) |
| *H01R 13/52* | (2006.01) |

(52) U.S. Cl.
CPC ............ *G06F 1/187* (2013.01); *G11B 33/122* (2013.01); *H01R 12/7082* (2013.01); *H01R 12/91* (2013.01); *H01R 13/521* (2013.01); *H05K 5/0069* (2013.01)

(58) Field of Classification Search
CPC ... G11B 33/122; H01R 13/521; H05K 5/0069

USPC ........................................................ 360/99.25
See application file for complete search history.

(56) References Cited

U.S. PATENT DOCUMENTS

| | | | |
|---|---|---|---|
| 5,514,838 A | 5/1996 | Wen et al. | |
| 5,978,169 A * | 11/1999 | Woods ................. | G11B 5/5556 360/77.04 |
| 6,429,999 B1 * | 8/2002 | Dague .................. | G11B 5/4806 360/264.3 |
| 6,702,592 B1 | 3/2004 | Harden et al. | |
| 6,927,113 B1 | 8/2005 | Sahota et al. | |
| 7,137,196 B2 | 11/2006 | Gunderson et al. | |
| 7,599,147 B2 * | 10/2009 | Gunderson ........ | G11B 33/1466 360/97.22 |
| 7,876,527 B2 * | 1/2011 | Nakamiya ............ | G11B 25/043 360/97.22 |

(Continued)

FOREIGN PATENT DOCUMENTS

WO    2008073159 A2    6/2008

*Primary Examiner* — Jefferson Evans
(74) *Attorney, Agent, or Firm* — Crawford Maunu PLLC

(57) ABSTRACT

As may be implemented in accordance with one or more embodiments, an electrical connector such as a low-temperature co-fired ceramic (LTCC) connector is sealed to an opening in a base deck having bottom and/or side walls that define a cavity. A mechanical component is coupled to balance forces applied to opposing surfaces of the electrical connector, which can mitigate the application of high forces to connector pins and/or to the connector itself. Further, this balancing may be implemented to maintain a controlled bias force against the connector. The electrical connector may, for example, be hermetically sealed to the opening by a seal such as a gasket, epoxy or other material, which may be included in the electrical connector.

20 Claims, 7 Drawing Sheets

(56) References Cited

U.S. PATENT DOCUMENTS

| | | | | |
|---|---|---|---|---|
| 8,194,348 B2* | 6/2012 | Jacoby | ............... | G11B 25/043 360/97.21 |
| 9,431,759 B2* | 8/2016 | Hirano | ............... | H01R 13/58 |
| 9,870,806 B2* | 1/2018 | Onobu | ............... | H01R 13/521 |
| 9,948,023 B2* | 4/2018 | Kida | ............... | H01R 13/4364 |
| 2006/0002067 A1* | 1/2006 | Gunderson | ............... | G11B 25/043 361/724 |
| 2006/0050429 A1* | 3/2006 | Gunderson | ............... | G11B 33/122 360/99.21 |
| 2009/0168233 A1* | 7/2009 | Kouno | ............... | G11B 33/1466 360/99.21 |
| 2012/0299187 A1 | 11/2012 | Oertle et al. | | |

* cited by examiner

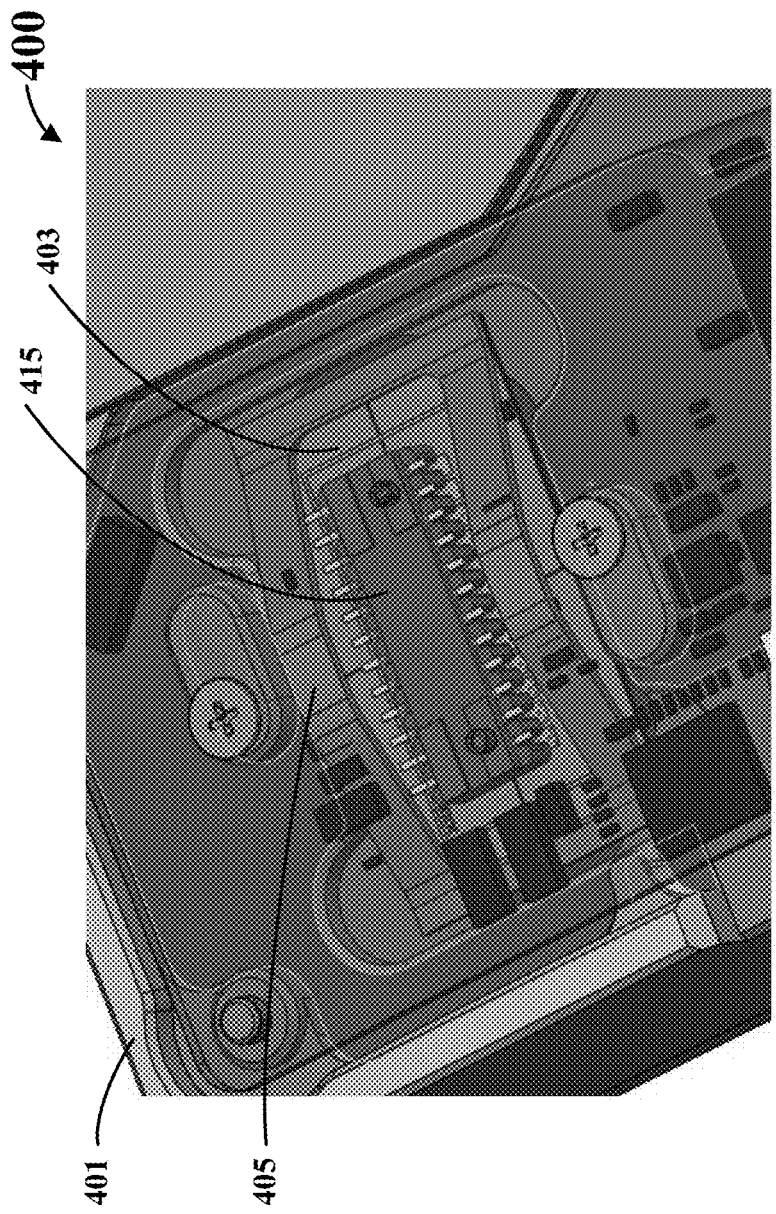

ELECTRICAL CONNECTOR WITH FORCE BALANCING

SUMMARY

Various example embodiments are directed to balancing and/or otherwise controlling forces applied to electrical componentry. Various such embodiments may, for example, help to protect electrical pins or other connectors, help to prevent cracking of supporting substrates, or help to maintain a seal between bulkheads/connectors and componentry in which the connectors are provided. In various embodiments, a mechanical component such as a spring operates to balance opposing forces applied to an electrical component in a manner that maintains a bias force against the electrical component in a particular direction. This spring balancing approach can further be implemented in a manner that limits an amount of force applied to electrical bulkheads/connectors or other components.

In accordance with a particular embodiment, an apparatus includes a base deck having a bottom wall and side walls that define a cavity, an electrical connector (e.g., bulkhead) and a mechanical component configured and arranged to balance forces applied to the opposing surfaces of the electrical connector. The bottom wall has an opening therein, with the electrical connector being located in the opening and therein providing an electrical pathway into the cavity. The electrical connector includes a multi-layer ceramic substrate having first and second opposing surfaces, with each layer having conductive regions that provide a plurality of conductive paths between the first and second opposing surfaces and through the multi-layer ceramic substrate. A seal, together with the base deck and the electrical connector, hermetically seals the opening. The mechanical component balances forces applied to the opposing surfaces of the electrical connector in response to connection of first electrical components within the cavity to second electrical components outside the cavity, via the plurality of conductive paths.

Another embodiment is directed to a disc drive apparatus including a base deck having bottom and side walls that define a cavity with an opening in the bottom wall, a storage medium (e.g., a rotatable disc drive) within the cavity, and a base deck cover coupled to the side walls and sealing the storage medium in the cavity. An electrical connector is sealed to the bottom wall, therein hermetically sealing the cavity. The electrical connector has a multi-layer ceramic substrate with first and second opposing surfaces, with each layer having conductive regions that provide a plurality of conductive paths between contacts on the first and second opposing surfaces and through the multi-layer ceramic substrate. The first surface may, for example, be coupled to a surface of the bottom wall around the opening. A seal operates with the base deck and the electrical connector to hermetically seal the cavity. A mechanical component balances forces applied to the electrical connector, such as may occur when first electrical components within the cavity are coupled to second electrical components outside the cavity via the contacts and plurality of conductive paths. This balancing mitigates forces exerted between the contacts and the electrical components during coupling of the first and second electrical components to the electrical connector, while maintaining a bias force that presses the first surface onto the surface of the bottom wall.

Another embodiment is directed to a method as follows. A base deck is provided with bottom and side walls that define a cavity, the bottom wall having an opening therein, and an electrical connector is coupled to the base deck at the opening. The electrical connector includes a multi-layer ceramic substrate having first and second opposing surfaces, each layer having conductive regions that provide conductive paths between the first and second opposing surfaces and through the multi-layer ceramic substrate. The opening is hermetically sealed by applying a seal with the base deck and the electrical connector. A mechanical component is provided and used to balance forces applied to the opposing surfaces of the electrical connector in response to connection of first electrical components within the cavity to second electrical components outside the cavity via the conductive paths. In various implementations, the first and second electrical components are respectively coupled to the first and second surfaces and the conductive paths, while using the mechanical component to balance forces applied by the first and second electrical components. These approaches can mitigate damage to the electrical components while maintaining a bias force that presses the electrical connector to the base deck around the opening.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIG. 4A is an isometric view of an apparatus, consistent with various aspects of the present disclosure.

Figure 1A:
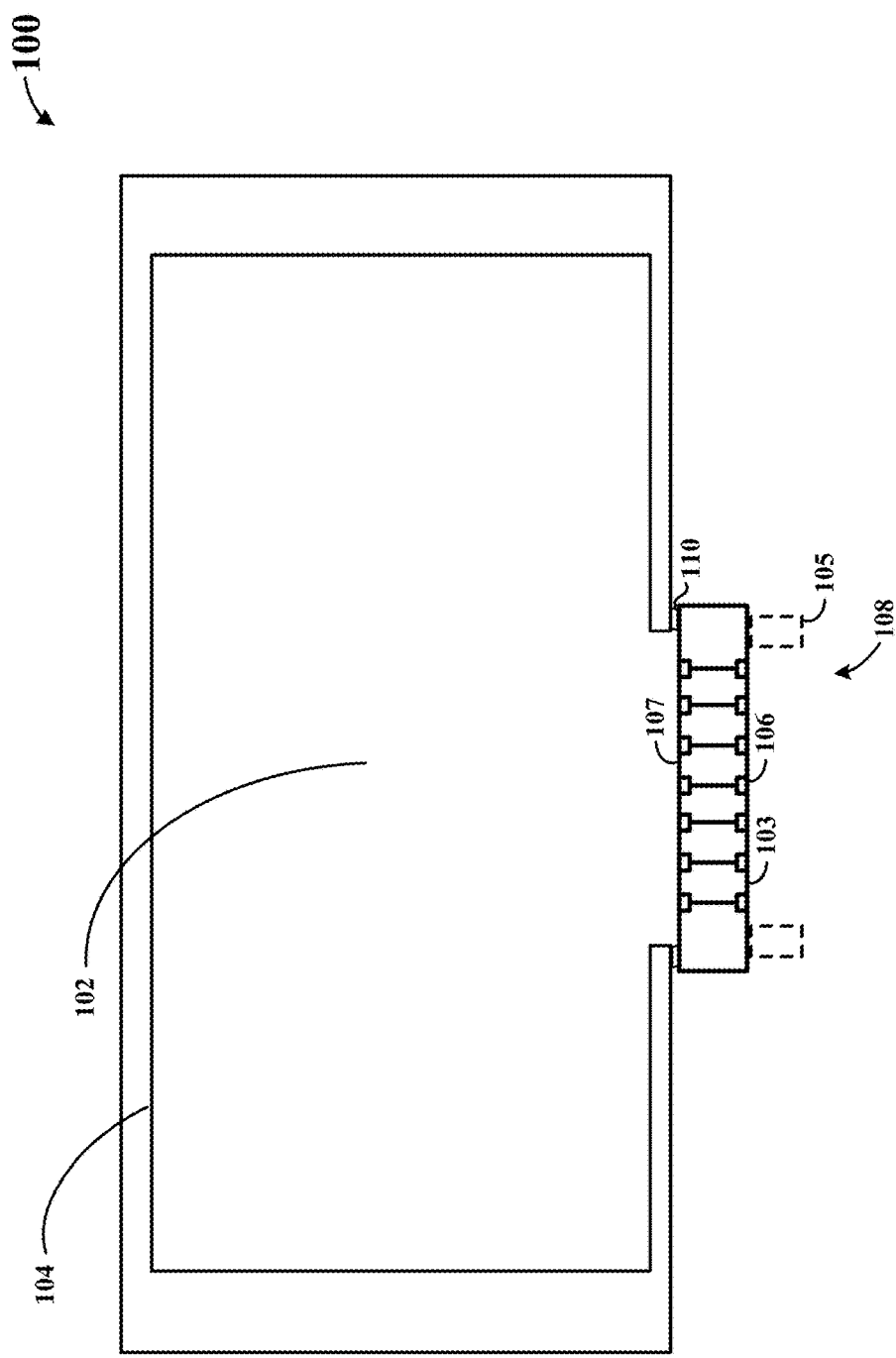
FIG. 1A is a cross-sectional side-view of an apparatus with an external bulkhead, consistent with various aspects of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving electrical connectors. In certain implementations, aspects of the present disclosure have been shown to be beneficial when used in the context of bulkheads/connectors that are used to provide an electrical path between a sealed cavity and an external environment, such as with hard disc drives. These and other aspects can be implemented to address challenges, including those discussed in the background above. While not necessarily so limited, various aspects may be appreciated through a discussion of examples using such exemplary contexts.

In accordance with a particular embodiment, an electrical connector such as a low-temperature co-fired ceramic (LTCC) connector is sealed to an opening in a base deck having bottom and/or side walls that define a cavity. Such connectors (as with others herein) may also be referred to as bulkheads. A mechanical component is coupled to balance forces applied to opposing surfaces of the electrical connector, such as may result from the connector being connected to other circuit components within and/or external to the cavity. For instance, where relatively stiff electrical pins or connectors are applied to one side of the electrical connector, the mechanical component may absorb forces applied thereto. The electrical connector may, for example, be hermetically sealed to the opening by a seal such as a gasket, epoxy or other material, which may be included in the electrical connector. In some implementations, the electrical connector includes a multi-layer ceramic substrate having first and second opposing surfaces, with each layer having conductive regions that provide a plurality of conductive paths between the first and second opposing surfaces and through the multi-layer ceramic substrate. Some embodiments include additional components, such as componentry within the cavity, further seals, or electrical components coupled to the electrical connector.

Various embodiments employ pliant connectors, via utilization of a mechanical component above to facilitate sealing. For instance, where a stiff connector may otherwise be desirable to hold a bulkhead in place, such a connector may instead be implemented with a pliant connector, utilizing a mechanical component to hold the bulkhead. In this context, the connectors can be made with some pliancy that helps to address issues with breakage of other undesirable aspects, while ensuring that the bulkhead is sealed.

The mechanical component balances forces applied to one or both opposing surfaces under various conditions, such as when electrical components within the cavity are connected to electrical components outside the cavity via the conductive paths. In some embodiments, the mechanical component includes a spring that counters forces applied to the electrical connector. For instance, such a spring can be coupled to mitigate the application of force between the electrical connector and electrical pins of components being connected thereto, as the connection is made. This approach can be effected, for example, by applying a spring force to a substrate, a circuit board coupled to the connector, or other chassis type components from which connector pins extend. A variety of spring-type structures can be used, such as a mechanical spring (or springs) placed between the electrical connector and components being connected thereto, or integrated with one or more of the electrical connector and electrical components connected thereto (e.g., a material with a spring constant or other compliant characteristics that permit bending).

In various embodiments, the mechanical component balances forces applied by respective electrical components, thereby mitigating the transfer of certain forces or changes in force onto the seal. For instance, a biased force can be maintained in which a higher force is applied to one of the electrical connector's surfaces, while limiting an amount of force placed upon circuit connectors coupled thereto. This approach may involve using the biased force to press the electrical connector against a surface of the wall in which the opening lies, assisting the maintenance of a seal.

In more particular embodiments, a captive plate is coupled to hold and/or mitigate forces relative to the electrical connector. The captive plate has a first surface that is placed in contact with a surface of the wall around the opening, and a second surface recessed from the first surface. The captive plate is coupled with the electrical connector in contact with the second surface, which provides support for sealing the connector around the opening.

Various embodiments are directed to mitigating silver migration while maintaining a compact design. In connection with these embodiments, it has been discovered that spacing between circuit components including silver can affect silver migration between the components. By setting a minimum distance at which little or no silver migration occurs, a compact design can be realized while mitigating issues relating to silver migration.

In various embodiments, silver-based contacts are used in connection with an electrical connector and cavity as discussed herein, with spacing set to mitigate silver migration. Each contact is configured and arranged relative to adjacent ones of the contacts and a designed operating voltage of the apparatus, with a minimum spacing between the contacts that mitigates (e.g., minimizes or eliminates) silver migration between the contacts. The spacing is set relative to the operating voltage level at which silver migration would occur between the contacts under conditions in which the contacts are spaced less than the minimum spacing. In some embodiments, the spacing is set at a distance that is greater than a threshold distance at which silver migration occurs between the contacts at an operating voltage to which the contacts are exposed, and less than a distance that is 10% greater than the threshold distance. This approach facilitates compact placement of the contacts while mitigating silver migration.

The apparatuses described herein can be implemented for a variety of circuitry and components employing an enclosure. As noted above, various embodiments are directed to disc drive apparatuses having a storage medium (e.g., a rotatable disc drive) within an enclosure. Such an enclosure may be implemented with a base deck having bottom and side walls, and a cover that collectively define a cavity with the enclosure and seal the storage medium therein. To facilitate electrical communication between componentry external to the enclosure and the storage medium (as well as related circuitry), an electrical connector is hermetically sealed to an opening in the bottom wall, providing an electrical path or paths into the cavity. In some instances, the electrical connector has a multi-layer ceramic substrate with first and second opposing surfaces, with each layer having conductive regions that provide a plurality of conductive paths between contacts on the first and second opposing surfaces and through the multi-layer ceramic substrate. The first surface may, for example, be coupled to a surface of the bottom wall around the opening. A variety of seals may be used, such as a gasket, epoxy or other component between the base deck and the electrical connector. A mechanical component balances forces applied to the electrical connector during connection, which can mitigate damage to connector pins or other aspects of the connector, and can also facilitate the application of a bias force that assists in maintaining the hermetic seal.

The mechanical component can be implemented in a variety of manners, such as with those described above and/or in connection with the figures. For instance, the mechanical component may include a spring component that counters force applied to the electrical connector via the electrical components. In various embodiments, the mechanical component maintains the hermetic seal between the opening in the cavity of the base deck and the electrical connector by mitigating relative shifts in force applied by the first and second electrical components onto the electrical connector. For instance, as an increased force is applied to a first side of the connector, a related increase and force can be applied on a second side of the connector, therein maintaining a relative force (e.g., about zero, or a bias force that biases the connector to facilitate a seal).

In some embodiments in which a spring is implemented, forces between contacts on the electrical component and pins extending from one or both of the first and second electrical components are limited. In particular, a spring force is applied in a direction away from the electrical connector, thereby mitigating damage to the electrical pins.

Figure 1B:
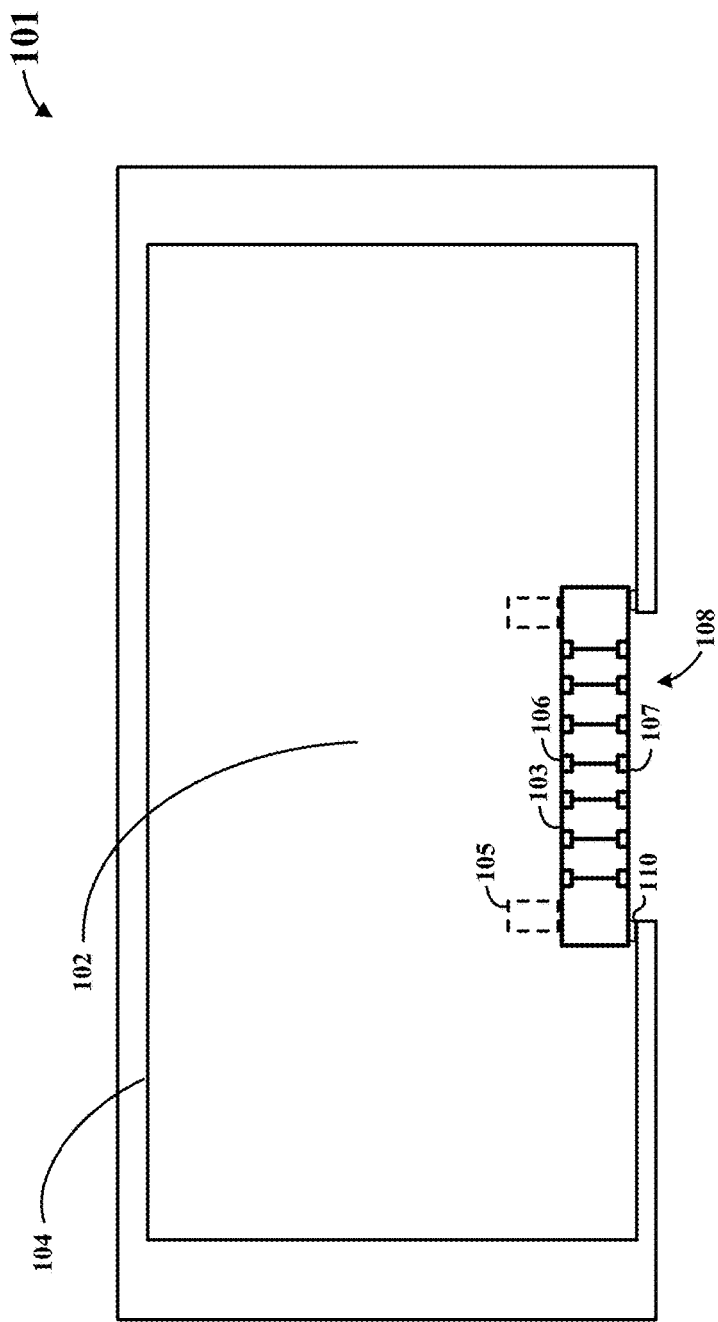
FIG. 1B is a cross-sectional side-view of an apparatus with an internal bulkhead, consistent with various aspects of the present disclosure.

Turning now to the figures, various embodiments of the present disclosure are presented by way of the illustrations. FIG. 1A is a cross-sectional side-view of an apparatus 100 with an outside connector, consistent with various aspects of the present disclosure. FIG. 1B shows a similar apparatus 101, labeled with similar indicators. The apparatus 100 includes an enclosure 104, such as a base deck, having a cavity 102 and an opening 108 through a wall of the enclosure. An electrical connector 103 is sealed to the enclosure 104 via one or more seals 110 adjacent the opening, and provides electrical paths between contacts (106 and 107 labeled by way of example) on opposing surfaces of the electrical connector. Few or more contacts may be implemented to suit particular embodiments. These contacts may, for example, be implemented with electrical pins, surfaces, recesses or other conductive components, and operate to electrically couple componentry within the cavity to external circuits. In some implementations, the electrical connector is layered, with each layer having conductive regions that provide conductive paths between the contacts. Such an approach may, for example, involve non-linear paths between the contacts.

During coupling of electrical components to the electrical connector 103, forces may be applied to the electrical connector 103 and/or to the electrical components. These forces may cause damage or negatively affect a seal between the connector 103 and the enclosure 104. Accordingly, various aspects of the present disclosure mitigate the application of forces during connection of electrical components to the electrical connector 103, such as by balancing forces applied to respective sides of the connector. In some embodiments, a mechanical component 105 operates to counter such forces, such as by providing a force in a direction away from the contact 106 (e.g., against connectors being coupled thereto). In various embodiments, this approach involves maintaining a bias force that presses the electrical connector 103 and seal 110 onto the enclosure 104.

Figure 2:
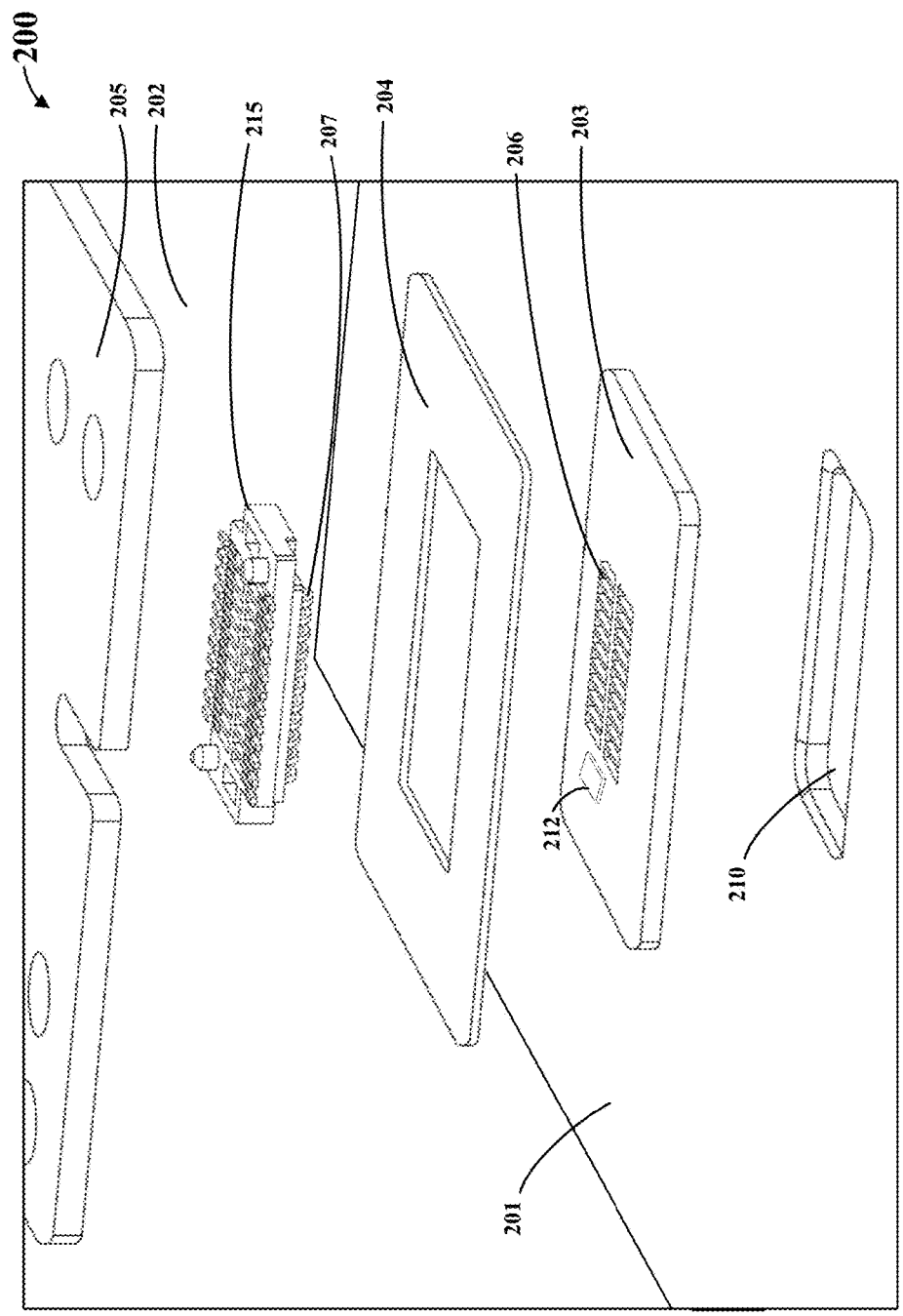
FIG. 2 is an exploded isometric view of an apparatus, consistent with various aspects of the present disclosure.

FIG. 2 is an exploded isometric view of an apparatus 200, consistent with various aspects of the present disclosure. A base deck 201 has an opening 210 within a wall thereof, into a cavity region 202. An electrical connector 203 is coupled to an area of the base deck 201 proximate the opening 210. A component 204 may be coupled between the base deck 201 adjacent the opening 210 and the electrical connector 203, and facilitate sealing of the electrical connector 203 around the opening 210 (e.g., with a seal integrated with an underlying surface of the electrical connector 203). The seal may be effected with a gasket, adhesive, or any other material that is capable of hermetically sealing an atmosphere within the cavity. In embodiments where the atmosphere within the cavity 202 is a low-density atmosphere, the seal may include material properties that would prevent the permeation of such low-density atmosphere through the seal material.

On both proximal and distal surfaces of the electrical connector 203, contact pads 206 are communicatively coupled to one another via conductive regions in the electrical connector 203. The conductive regions provide conductive paths between contact pads 206 on opposite sides of the electrical connector 203. Accordingly, when pins 207 of electrical component 215 are coupled to the contact pads 206 of the electrical connector 203, electrical signals may be passed between the cavity 202 and the exterior of the base deck 201 while maintaining the hermetic seal of the cavity.

To prevent damage to the seal while coupling an external electrical component to the electrical connector 203, the coupling force is transmitted through the electrical connector 203, internal electrical component 215, and into a printed circuit board 205 that is communicatively coupled to the electrical component 215. The printed circuit board 205 may operate with the electrical connector 203 and the electrical component 215 to provide a balancing force, relative to forces applied to the electrical connector 203 via external components. In some embodiments, a mechanical component 212, such as a spring-like structure, operates to counter forces applied via the electrical component 215; a similar component can be used on an opposing side of the electrical connector 203 for external componentry coupled to the electrical connector via the opening 210. In these manners, such a balancing force can be implemented to maintain a bias force that helps to hold the electrical connector 203 against the base deck 201.

Figure 3A:
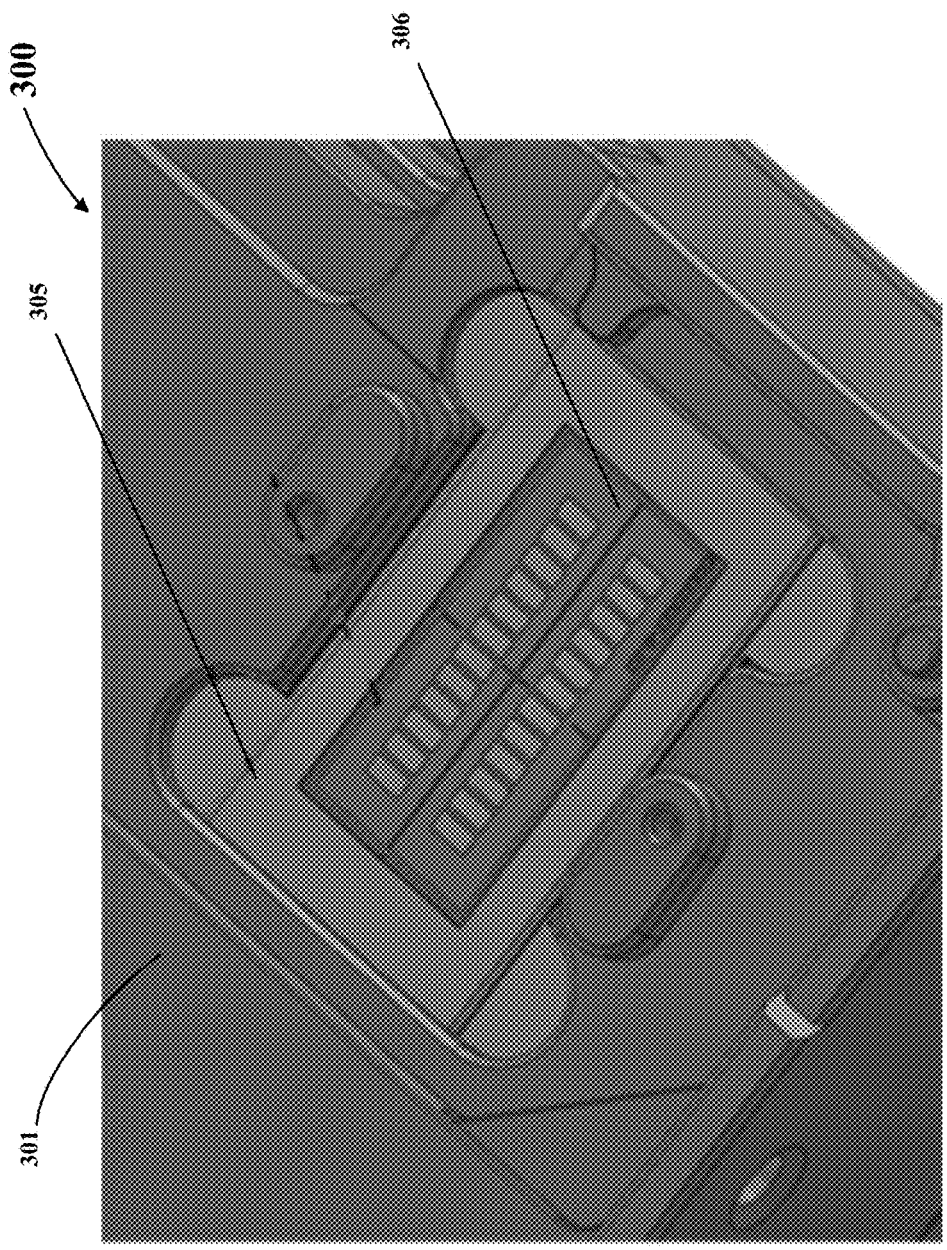
FIG. 3A is an isometric view of an apparatus, consistent with various aspects of the present disclosure.

FIG. 3A is an isometric view of an apparatus 300, consistent with various aspects of the present disclosure. A base deck 301 is shown with an electrical connector 306 filling an opening in the cavity that provides access to an area external to the base deck. A mechanical component 305 extends along the periphery of the electrical connector, and is fastened to the base deck 301 to support the electrical connector 306 and to couple the electrical connector to the base deck 301.

Figure 3B:
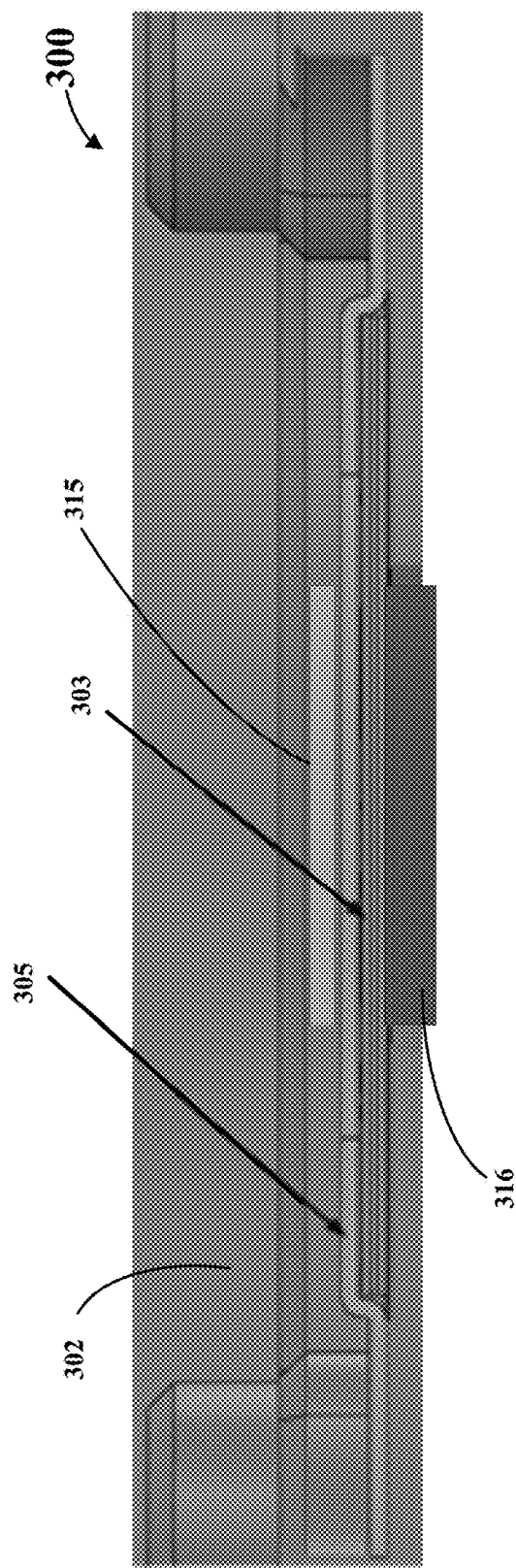
FIG. 3B is a cross-sectional side view of the apparatus of FIG. 3A, consistent with various aspects of the present disclosure.

FIG. 3B is a cross-sectional side view of the apparatus 300 of FIG. 3A, consistent with various aspects of the present disclosure. After the mechanical component 305 has been coupled to the base deck 301 within the cavity 302, and has captured the electrical connector 303 between the base deck and the mechanical component, first and second electrical components (315 and 316) may be coupled to the electrical connector 303. The coupling of the first and second electrical components 315 and 316 produce forces on the electrical connector 303. These produced forces may be counteracted by forces exerted by the mechanical component 305 (and/or other components such as a spring), which are similarly applied to the electrical connector 303. The forces balance, mitigating the transfer of the produced forces onto the joint between the electrical connector and the base deck 301.

FIG. 4A is an isometric view of an apparatus 400, consistent with various aspects of the present disclosure. A base deck 401 is shown, with a low-temperature co-fired ceramic (LTCC) connector 403 coupled adjacent to an opening in the base deck. The LTCC connector 403 includes electrical connector pads on both proximal and distal surfaces, with the electrical connector pads being communicatively coupled to electrical components via conductive paths extending through the LTCC connector. This couples electrical signals into and out of a cavity of the base deck 401. The LTCC connector is hermetically sealed to the opening in the base deck 401. A mechanical component 405 (e.g., a spring) is positioned along at least a portion of the LTCC connector 403.

Figure 4B:
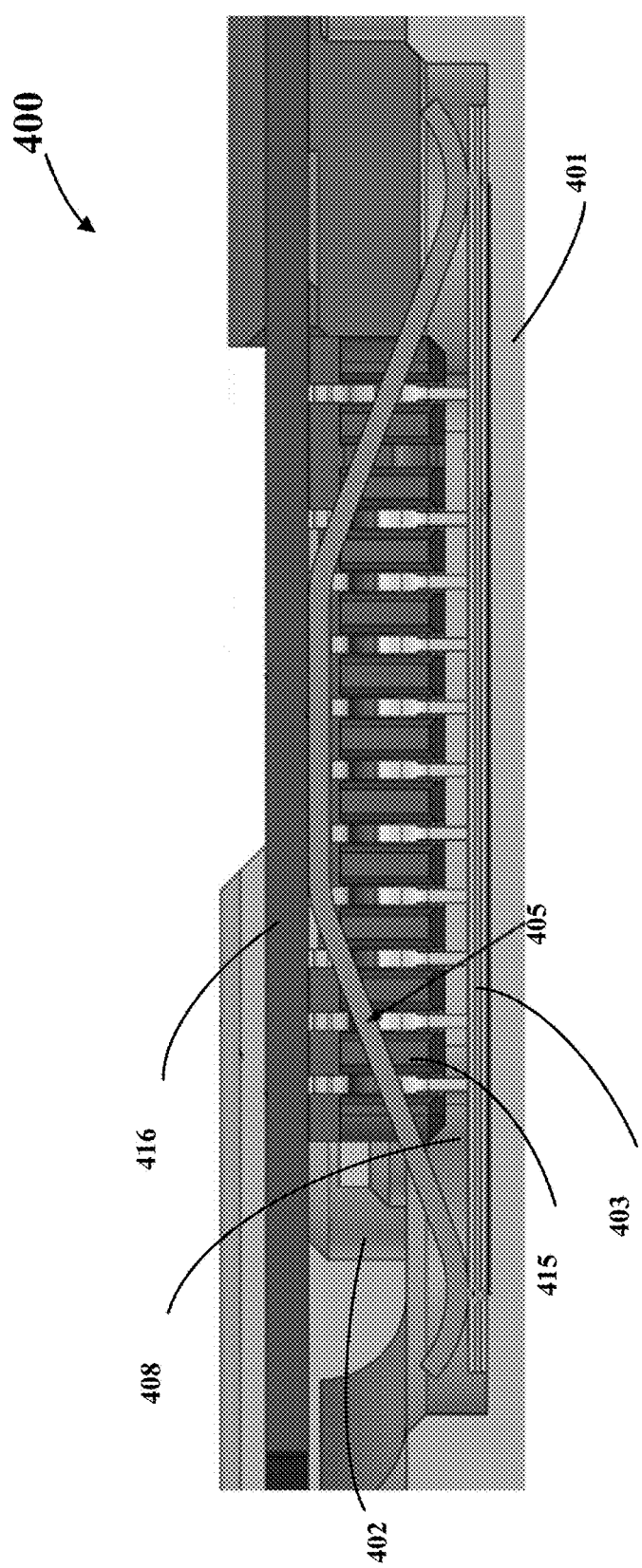
FIG. 4B is a cross-sectional side view of the apparatus of FIG. 4A, consistent with various aspects of the present disclosure.

FIG. 4B is a cross-sectional side view of the apparatus 400 of FIG. 4A, consistent with various aspects of the present disclosure. Prior to sealing an opening the base deck 401, an electrical component 415 is coupled to a proximal surface 408 of the LTCC connector 403 and a printed circuit board (PCB) 416 is fastened to the base deck 401 while coupled to the electrical component 415. By fastening the PCB 416 to the base deck 401, the mechanical component 405 is deformed, placing a pre-load force upon both the PCB 416 and the outer periphery of the LTCC connector 403. The pre-load force places a compression force upon the joint between the LTCC connector 403, the base deck 401, and the seal therebetween. When installing an electrical component to an exterior surface of the LTCC connector 403, a coupling force applied to the LTCC connector is countered by the pre-load force.

Based upon the above discussion and illustrations, those skilled in the art will readily recognize that various modifications and changes may be made to the various embodiments without strictly following the exemplary embodiments and applications illustrated and described herein. For example, an apparatus can include different combinations and configurations, than illustrated in the Figures, such as by combining aspects of different figures (e.g., bias spring components, integrated springs, and captive plates). In addition, embodiments characterized as being implemented with a base deck can be implemented with other enclosures. Such modifications do not depart from the true spirit and scope of various aspects of the invention, including aspects set forth in the claims.

What is claimed is:

1. An apparatus comprising:
 a base deck having a bottom wall and side walls that define a cavity, the bottom wall having an opening therein;
 an electrical connector including a substrate having first and second opposing surfaces and conductive regions that provide a plurality of conductive paths between the first and second opposing surfaces and through the substrate, one of the first and second opposing surfaces of the electrical connector substrate interfacing and in direct contact with a surface of the cavity at the opening;
 a seal configured and arranged with the base deck and the electrical connector to hermetically seal the opening; and
 a mechanical component configured and arranged to balance forces applied to the first and second opposing surfaces of the electrical connector in response to connection of first electrical components within the cavity to second electrical components outside the cavity via the plurality of conductive paths.

2. The apparatus of claim 1, wherein
 one of the first and second opposing surfaces faces an inner wall surface or an outer wall surface of the bottom wall; and
 the mechanical component includes a spring component configured and arranged to counter force applied to the first and second opposing surfaces of the electrical connector at the opening, via the first and second electrical components.

3. The apparatus of claim 2, wherein the spring component is configured and arranged with one of the first and second opposing surfaces and the base deck to mitigate the application of force between the one of the first and second opposing surfaces and electrical pins extending from one of the first and second electrical components, by applying a spring force upon the one of the first and second electrical components in a direction away from the electrical connector.

4. The apparatus of claim 3, wherein applying the spring force includes applying the spring force upon a supporting structure, in the one of the first and second electrical components, from which the electrical pins extend.

5. The apparatus of claim 1, wherein the mechanical component is configured and arranged to balance the force by maintaining a biased force in which a higher force is applied to one of the first and second surfaces relative to the other one of the first and second surfaces, while limiting an amount of force placed upon circuit connectors on the first and second surfaces, the biased force acting to press the electrical connector against a surface of the bottom wall adjacent the opening.

6. The apparatus of claim 1, wherein the electrical connector includes the seal, the electrical connector being further configured and arranged with the base deck to hermetically seal the opening.

7. The apparatus of claim 1, further including the first electrical and second electrical components, the first and second electrical components being respectively connected to the first and second opposing surfaces and to one another via the plurality of conductive paths within the electrical connector.

8. The apparatus of claim 7, wherein at least one of the first and second electrical components include pliant electrical connectors configured and arranged to bend upon coupling to the electrical connector, and wherein the mechanical component is configured and arranged to provide a sealing force that seals the electrical connector onto a surface of the base deck, therein facilitating connection of the electrical components with about no force applied by the electrical components to seal the electrical connector to the base deck.

9. The apparatus of claim 1, wherein the mechanical component is a spring component, and wherein the electrical connector includes the spring component.

10. The apparatus of claim 1, wherein
 the mechanical component includes a spring component coupled between the electrical connector and a printed circuit board within the cavity, and
 the first electrical components communicatively couple the printed circuit board to the second electrical components outside of the cavity via the electrical connector.

11. The apparatus of claim 1, wherein the mechanical component is further configured and arranged to produce a counteracting force that balances forces applied to the electrical connector by the first and second electrical components, thereby mitigating the transfer of the force onto the seal.

12. The apparatus of claim 1, further including a captive plate having a first surface in contact with a surface of the bottom wall around the opening and around the electrical connector, and a second surface recessed from the first surface, with the electrical connector being in contact with the second surface.

13. An apparatus comprising:
a base deck having a bottom wall and side walls that define a cavity, the bottom wall having an opening therein;
an electrical connector including a substrate having first and second opposing surfaces and conductive regions that provide a plurality of conductive paths between the first and second opposing surfaces and through the substrate, the electrical connector being coupled to the cavity at the opening;
a seal configured and arranged with the base deck and the electrical connector to hermetically seal the opening;
a mechanical component configured and arranged to balance forces applied to the first and second opposing surfaces of the electrical connector in response to connection of first electrical components within the cavity to second electrical components outside the cavity via the plurality of conductive paths; and
a plurality of silver-based contacts, each contact being configured and arranged relative to adjacent ones of the contacts and an operating voltage of the apparatus, with a minimum spacing between the contacts that mitigates silver migration between the contacts during exposure of the contacts to the operating voltage, the operating voltage being at a level at which silver migration would occur between the contacts under conditions in which the contacts are spaced less than the minimum spacing.

14. An apparatus comprising:
a base deck having a bottom wall and side walls that define a cavity, the bottom wall having an opening therein;
an electrical connector including a substrate having first and second opposing surfaces and conductive regions that provide a plurality of conductive paths between the first and second opposing surfaces and through the substrate, the electrical connector being coupled to the cavity at the opening and having a plurality of silver-based contacts configured and arranged to operate at an operating voltage, with immediately adjacent ones of the contacts being spaced at a distance from one another that is greater than a threshold distance at which silver migration occurs between the contacts at the operating voltage and less than a distance that is 10% greater than the threshold distance, thereby facilitating compact placement of the contacts while mitigating silver migration;
a seal configured and arranged with the base deck and the electrical connector to hermetically seal the opening; and
a mechanical component configured and arranged to balance forces applied to the first and second opposing surfaces of the electrical connector in response to connection of first electrical components within the cavity to second electrical components outside the cavity via the plurality of conductive paths.

15. A disc drive apparatus comprising:
a base deck including bottom and side walls that define a cavity, with an opening in the bottom wall;
a storage medium within the cavity, the storage medium configured and arranged to rotate and to store data therein;
a base deck cover coupled to the side walls and configured and arranged to seal the storage medium in the cavity;
an electrical connector including a multi-layer ceramic substrate having first and second opposing surfaces, each layer having conductive regions that provide a plurality of conductive paths between contacts on the first and second opposing surfaces and through the multi-layer ceramic substrate, the first surface being coupled to a surface of the bottom wall around the opening;
a seal configured and arranged with the base deck and the electrical connector to hermetically seal the cavity; and
a mechanical component configured and arranged to
balance forces applied to the electrical connector in response to connection of first electrical components within the cavity to second electrical components outside the cavity via the contacts and plurality of conductive paths, and
mitigate forces exerted between the contacts and the electrical components during coupling of the first and second electrical components to the electrical connector, while maintaining a bias force that presses the first surface onto the surface of the bottom wall.

16. The disc drive apparatus of claim 15, wherein the mechanical component is configured and arranged to maintain the hermetic seal between the opening in the cavity of the base deck and the electrical connector by mitigating relative shifts in force applied by the first and second electrical components onto the electrical connector.

17. The disc drive apparatus of claim 15, wherein the mechanical component includes a spring component configured and arranged to counter force applied to the electrical connector via the electrical components.

18. The disc drive apparatus of claim 17, wherein the spring component is configured and arranged with one of the first and second opposing surfaces and the base deck to mitigate the application of force between the one of the first and second opposing surfaces and electrical pins extending from one of the first and second electrical components, by applying a spring force upon the one of the first and second electrical components in a direction away from the electrical connector, thereby mitigating damage to the electrical pins.

19. A method comprising:
providing a base deck having bottom and side walls that define a cavity, the bottom wall having an opening therein;
coupling an electrical connector to the base deck at the opening, the electrical connector including a substrate having first and second opposing surfaces and having conductive regions that provide a plurality of conductive paths between the first and second opposing surfaces and through the substrate, one of the first and second opposing surfaces of the electrical connector being interfaced with and directly contacting an interior or exterior surface of the cavity at the opening;
hermetically sealing the opening by applying a seal with the base deck and the electrical connector; and
providing a mechanical component configured and arranged to balance forces applied to the first and second opposing surfaces of the electrical connector in response to connection of first electrical components within the cavity to second electrical components outside the cavity via the plurality of conductive paths.

20. The method of claim 19, further including coupling the first and second electrical components respectively to the first and second surfaces and the conductive paths, with said one of the first and second opposing surfaces of the electrical connector being in direct contact with the interior or exterior surface of the cavity at the opening, while using the mechanical component to balance forces applied by the first and second electrical components, thereby mitigating damage to the electrical components while maintaining a bias force that presses the electrical connector to the base deck around the opening.

\* \* \* \* \*